(12) United States Patent
Shin et al.

(10) Patent No.: US 7,770,951 B2
(45) Date of Patent: Aug. 10, 2010

(54) MICRO GRIPPER AND METHOD FOR MANUFACTURING THE SAME

(75) Inventors: Kyu Sik Shin, Namyangju-si (KR); Joon Shik Park, Gunpo-si (KR); Kwang Bum Park, Pyeongtaek-si (KR); Chan Woo Moon, Seoul (KR)

(73) Assignee: Korea Electronics Technology Institute (KR)

( * ) Notice: Subject to any disclaimer, the term of this patent is extended or adjusted under 35 U.S.C. 154(b) by 1164 days.

(21) Appl. No.: 11/278,066

(22) Filed: Mar. 30, 2006

(65) Prior Publication Data

US 2006/0220403 A1    Oct. 5, 2006

(30) Foreign Application Priority Data

Mar. 31, 2005  (KR) .................. 10-2005-0026857
Feb. 3, 2006   (KR) .................. 10-2006-0010644

(51) Int. Cl.
*B25J 7/00* (2006.01)
(52) U.S. Cl. .................................. 294/86.4
(58) Field of Classification Search ........... 294/86.4, 294/902, 119.3; 901/36, 39
See application file for complete search history.

(56) References Cited

U.S. PATENT DOCUMENTS

| 3,640,564 | A | * | 2/1972 | Kuster | 294/119.3 |
| 3,720,433 | A | * | 3/1973 | Rosfelder | 294/64.1 |
| RE28,663 | E | * | 12/1975 | Baer | 294/119.3 |
| 4,674,915 | A | * | 6/1987 | Shatto, Jr. | 294/66.1 |
| 7,461,882 | B2 | * | 12/2008 | Choi et al. | 294/86.4 |

OTHER PUBLICATIONS

Park, J. et al.; Abstract Collection of Fall Academic Seminar Society for Korea Metallurgy and Material Study 2005; Oct. 27-28, 2005; Design and Fabrication of In-Plain Type Piezoelectrically Driven Micro Grippers With Pneumatic Lines.

\* cited by examiner

*Primary Examiner*—Paul T Chin

(57) ABSTRACT

A micro gripper and a method for manufacturing the same are disclosed. The manufacturing method of the micro gripper supplies a fluid to a penetration hole of a gripper jaw, and discharges the fluid from opposite surfaces of the first and second structures of the micro gripper, thereby completely detaching the object attached on the opposite surfaces of the first and second structures by electrostatic force and removing the stiction. Furthermore, the present invention can grip the object more strongly by sucking the fluid from the penetration hole of the gripper jaw, when the first and second structures of the gripper jaw grip the object.

4 Claims, 14 Drawing Sheets

US 7,770,951 B2

MICRO GRIPPER AND METHOD FOR MANUFACTURING THE SAME

CLAIM FOR PRIORITY

This application is based on and claims priority to Korean Patent Application No. 10-2005-0026857 filed on Mar. 31, 2005 and 10-2006-0010644 filed on Feb. 3, 2006 in the Korean Intellectual Property Office (KIPO), the entire contents of which are hereby incorporated by reference.

BACKGROUND

This description relates in general to the field of a micro gripper and method for manufacturing the same.

Recently, with the advancement of small-size and light-weighted electronic components, a microstructure, a micro sensor or an actuator has been developed using a semiconductor process.

Further, with an increased interest in the human body, research on operation of the bio cells has been advanced.

However, equipment, which can move, fix and combine objects such as the microstructure or the bio cells, has not been actually provided.

Under these circumstances, study for a micro gripper which is precisely movable so as to enable micro electronic components, such as the microstructure and the actuator, and an object such as the bio cell to be fixed, moved and combined is needed.

The micro gripper is a mechanism that can grip or release a micro object at a desired position, for the purpose of assembly of micro components and micro-position control.

A micro gripper driving method may be classified into a thermal driving method, an electrostatic driving method, a piezoelectric driving method, a pneumatic driving method and a hybrid driving method.

The thermal drive micro gripper has disadvantages such as a high driving voltage, energy consumption and difficulty in application to a bio-field, because an object using thermal expansion of the object due to the Joule heat generated from an applied voltage is gripped.

The electrostatic micro gripper performs the gripping of an object using electrostatic force between two applied charges. The electrostatic micro gripper has disadvantages such as driving displacement to a voltage and weak gripping force, and may not properly release an object due to stiction caused by electrostatic force, after gripping.

The piezoelectric micro gripper has advantages such as minute driving control and strong gripping force, but there exists a need to minimize the specific hysteresis shape of a piezoelectric object.

The pneumatic micro gripper may be applied to a variety of fields such as the bio-field, without special energy sources such as a voltage because it uses the pneumatic.

Further, the pneumatic micro gripper may grip an object appropriately since it can be manufactured in the shape of a finger joint.

However, as the pneumatic micro gripper has a weak gripping force in case of gripping an object, it is difficult to perform pneumatic control and process, and it is necessary for separate package processes for allowing the air to enter, thereby increasing entire manufacturing cost.

FIG. 1 is a schematic perspective view illustrating a conventional micro gripper 10.

The micro gripper 10 is composed of structures 11 and 12 of a pair of gripper jaws that are spaced while facing to each other.

The micro gripper 10 can manipulate micro components and bio cells precisely by performing the gripping by means of an actuator.

The actuator mainly uses a pneumatic driving method.

FIG. 2a or FIG. 2b is a schematic cross-sectional view explaining a driving method of the conventional micro gripper.

As shown in FIG. 2a, structures 11 and 12 of a pair of gripper jaws grip a target object 20 by narrowing a distance between the structures 11 and 12 by the driving of the actuator.

Afterwards, a force for gripping the target object 20 is released by broadening the distance between the structures 11 and 12 of the gripper jaws.

At this time, as shown in FIG. 2b, when the micro gripper grips a target object 20 below 100 µm, the electrostatic force is generated between the target object 20 and the structures 11 and 12 of the gripper jaw and thus a stiction phenomenon where the target object becomes stuck to the structures 11 and 12 of the gripper jaw is generated.

As described above, when using the conventional micro gripper, it is difficult to release the micro object at a desired position because it is difficult to grip or control the micro object.

SUMMARY

An object of the present invention is to provide a micro gripper and method for manufacturing the same, which supply a fluid to a penetration hole of the micro gripper if an object is detached from first and second structures of a gripper jaw, and discharge the fluid from opposite surfaces of the first and second structure of the gripper jaw, completely detaching the object attached to the opposite surfaces of the first and second structures by electrostatic force and removing the stiction.

Another object of the present invention is to provide a micro gripper and method for manufacturing the same, which can grip an object more strongly by sucking a fluid from a penetration hole of a micro gripper jaw, at the time of first and second structures of the gripper jaw gripping the object.

Still another object of the present invention is to provide a method for manufacturing a micro gripper, which can simply manufacture a micro gripper jaw by electroplating and substrate bonding.

According to a first aspect of the present invention, there is provided a micro gripper, comprising a micro gripper jaw composed of first and second structures each oppositely spaced a predetermined distance (d1) apart, in which penetration holes that enable a fluid to flow are respectively formed inside of respective structures and the penetration holes are exposed on respective opposite surfaces of the first and second structures; a force transmission part connected to the first and second structures of the gripper jaw and transmit a force, so that an object can be gripped by narrowing the distance between the first and second structures of the gripper jaw; an actuator configured to provide a force to the force transmission part; and a fluid supply and absorption part configured to supply a fluid to the penetration holes of the gripper jaw so as to detach the object attached to the opposite surfaces of the first and second structures, or suck a fluid from the penetration holes of the gripper jaw so as to enable the first and second structures to strongly grip the object.

According to a second aspect of the present invention, there is provided a method for manufacturing a micro gripper, comprising depositing a seed layer on an upper surface of a substrate; forming a pair of metal islands each spaced a predetermined distance apart on an upper surface of the seed layer; forming a photoresist layer on respective central upper surfaces of the pair of first metal islands; depositing a metal while surrounding the pair of metal islands, including the photoresist layer; forming on the upper surface of the seed layer a micro gripper jaw composed of the first and second structures each spaced a predetermined distance apart, in which the first and second structures, being made of metal, has a penetration hole formed thereinside by removing the photoresist layer; and separating the gripper jaw from the substrate and the seed layer.

According to a third aspect of the present invention, there is provided a method for manufacturing a micro gripper, comprising forming first to fifth grooves each spaced a predetermined distance apart, on an upper surface of a first substrate; attaching a second substrate on the upper surface of the first substrate on which the first to fifth grooves are formed; and forming a micro gripper jaw composed of the first and second structures each oppositely spaced a predetermined distance apart, in which penetration holes are formed inside of the attached first and second substrates by removing the first and second substrates corresponding to the first, third and fifth grooves.

DETAILED DESCRIPTION

Figure 1:
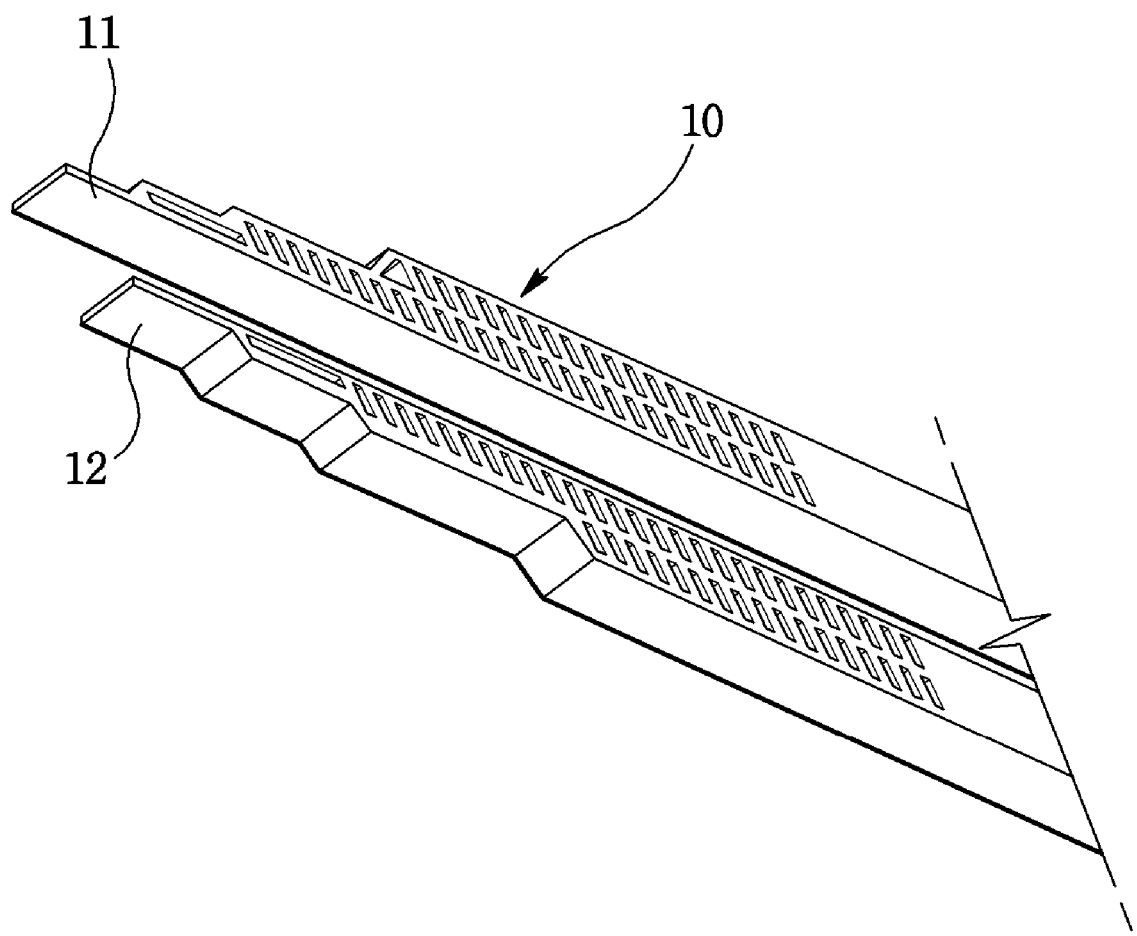
FIG. 1 is a schematic perspective view illustrating a conventional micro gripper.
Figure 2A:
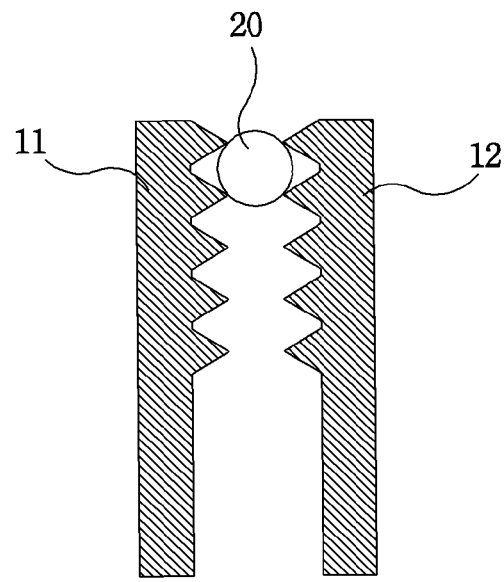
FIGS. 2a and 2b are a schematic cross-sectional view explaining a driving method of the conventional micro gripper.
Figure 2B:
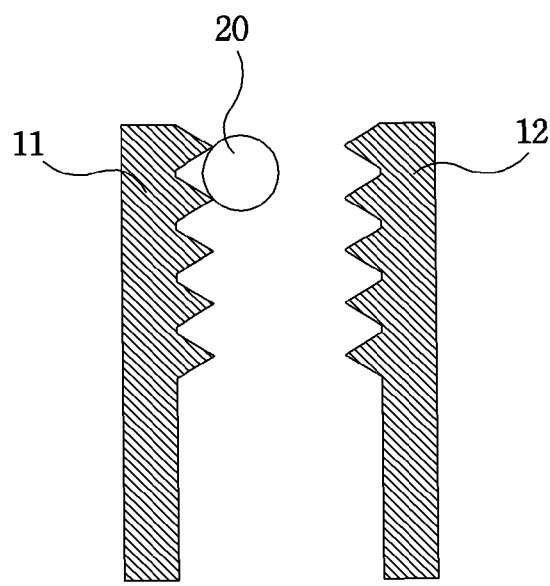
Figure 3:
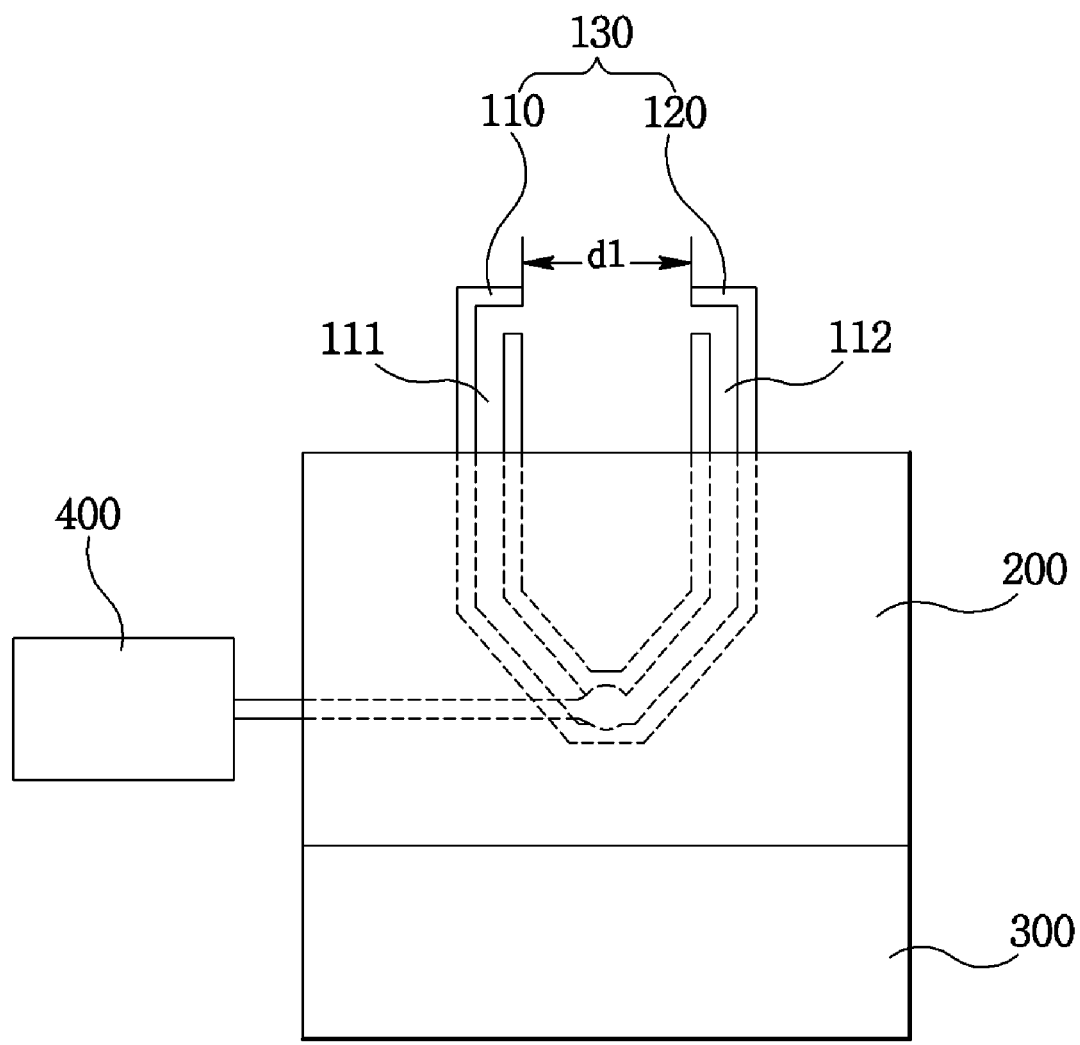
FIG. 3 is a schematic configuration view illustrating a micro gripper according to an exemplary embodiment of the present invention.

FIG. 3 is a schematic configuration view of the micro gripper according to an exemplary embodiment of the present invention.

The micro gripper includes: a micro gripper jaw 130 composed of first and second structures 110 and 120 each oppositely spaced a predetermined distance (d1) apart, in which penetration holes 111 and 112 which enable a fluid to flow are respectively formed inside the structures 110 and 120, and the penetration holes 111 and 112 are exposed on respective opposite surfaces of the first and second structures 110 and 120; a force transmission part connected to the first and second structures 110 and 120 of the gripper jaw 130 for transmitting a force, so that an object can be gripped by narrowing the distance between the first structure 110 and the second structure 120 of the gripper jaw 130; an actuator 300 providing the force to the force transmission part; and a fluid supply and suction unit 400 configured to supply a fluid to the penetration holes 111 and 112 of the gripper jaw 130 so as to detach an object attached to the opposite surfaces of the first and second structures 110 and 120, or suck a fluid from the penetration holes 111 and 112 of the gripper jaw 130 so as to enable the first and second structures 110 and 120 to strongly grip an object.

It is preferable that the fluid supply and suction unit 400 be a pump.

It is preferable that the fluid be a liquid or a gas.

The micro gripper according to the present invention may grip an object more strongly by enabling the fluid supply and suction unit 400 to suck the fluid from the penetration holes 111 and 112 of the gripper jaw 130, if the first and second structures 110 and 120 of the gripper jaw 130 grip the object.

Further, if the object is detached from the first and second structures of the gripper jaw 130, the fluid is supplied to the penetration holes 111 and 112 of the gripper jaw 130 and discharged from the opposite surfaces of the first and second structures 110 and 120 of the gripper jaw 130 facing each other, so that the object, attached to the opposite surfaces of the first and second structures 110 and 120 by electrostatic force, may be completely detached.

It is desirable that the actuator 190 use a piezoelectric driving method using electrostatic force.

Figure 4A:
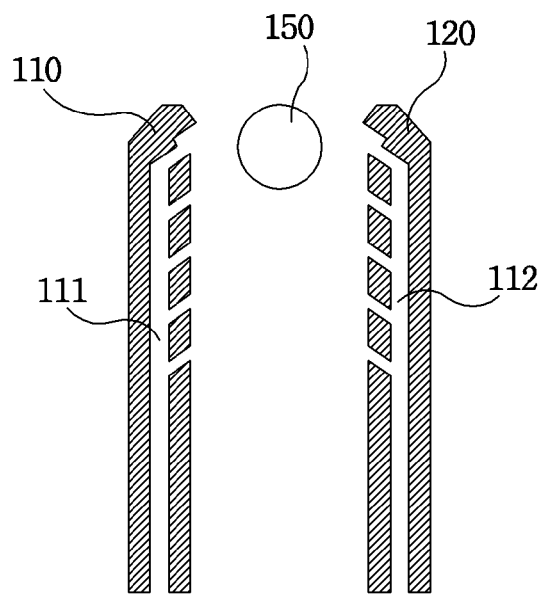
FIGS. 4a to 4c are schematic cross-sectional views illustrating a state where the micro gripper is operated according to an exemplary embodiment of the present invention.
Figure 4B:
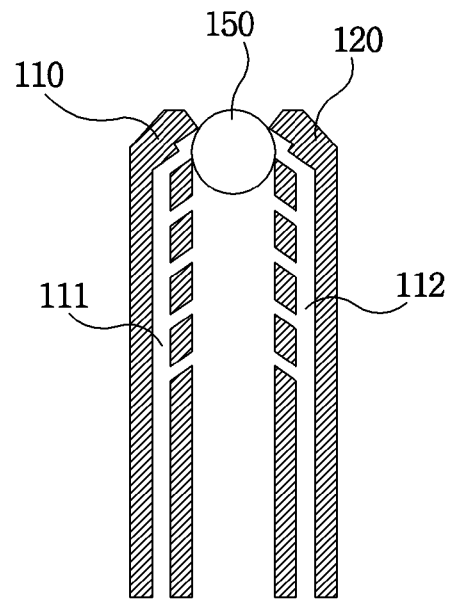
Figure 4C:
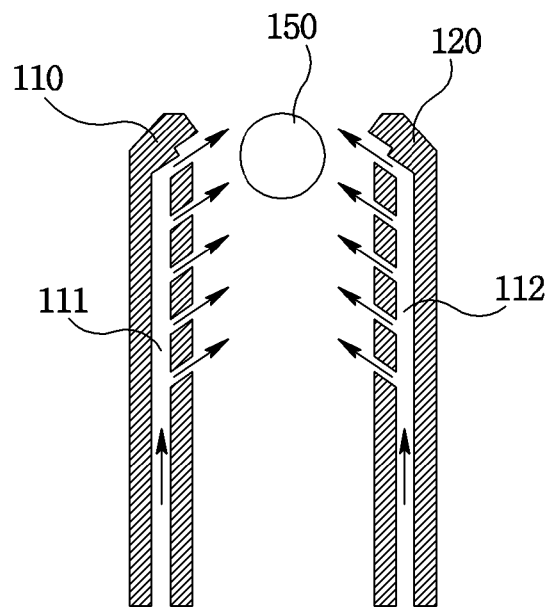

FIGS. 4a to 4c are schematic cross-sectional views illustrating a state where a gripper jaw of the micro gripper is operated according to the present invention.

First, as shown in FIG. 3, there is provided the micro gripper having the gripper jaw 130 that is composed of the first and second structures 110 and 120 that are spaced apart by the interval (d1) while facing toward each other, in which the penetration holes 111 and 112 that enable a fluid to flow are respectively formed inside of respective structures 110 and 120, and the penetration holes 111 and 112 are respectively exposed on opposite surfaces of the first and second structures 110 and 120.

The penetration holes 111 and 112 are respectively divided into at least two or more penetration holes, and, as shown in FIG. 4a, and preferably that the divided penetration holes are exposed on respective opposite surfaces of the first and second structures 110 and 120.

Next, a micro object 150 is positioned between the first structure 110 and second structure 120 of the gripper jaw. (FIG. 4a)

Next, the object 150 is gripped by narrowing the distance (d1) between the first and second structures 110 and 120 of the gripper jaw. (FIG. 4b)

If the first and second structures 110 and 120 of the gripper jaw grip the micro object 150, the first and the second structures 110 and 120 may grip the micro object more strongly if the fluid is sucked from the penetration holes 111 and 112 of the gripper jaw 130.

Additionally, the micro object 150 attached to one of the first and second structures 110 and 120 is detached from the first and second structures 110 and 120 by moving to a desired position, releasing the gripping of the micro object 150 while broadening the distance d1 between the first and second structures 110 and 120, supplying the fluid to respective penetration holes 111 and 112 of the first and second structures 110 and 120, and discharging the fluid to the opposite surfaces of the first and second structures 110 and 120. (FIG. 4c)

Figure 5:
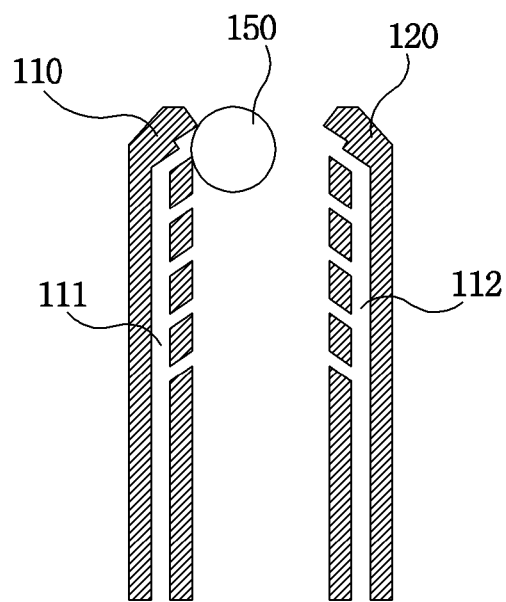
FIG. 5 is a schematic plan view illustrating a state where a micro object is attached to the micro gripper according to an exemplary embodiment of the present invention.

FIG. 5 is a schematic plan view illustrating a state wherein a micro object is attached to the micro gripper according to the present invention.

If the micro gripper does not release the gripping of the micro object 150 while discharging the fluid, as shown in FIG. 3c, the stiction phenomenon, in which the micro object 150 is stuck by the electrostatic force, is generated on one of the first and second structures 110 and 120 of the gripper jaw, as shown in FIG. 5.

Accordingly, in the micro gripper, penetration holes that enable a fluid to flow are formed in the gripper jaw, and the micro object attached to the first and second structures 110 and 120 of the gripper is detached by squirting the fluid flowing through the penetration holes, thereby solving the stiction phenomenon.

Figure 6A:
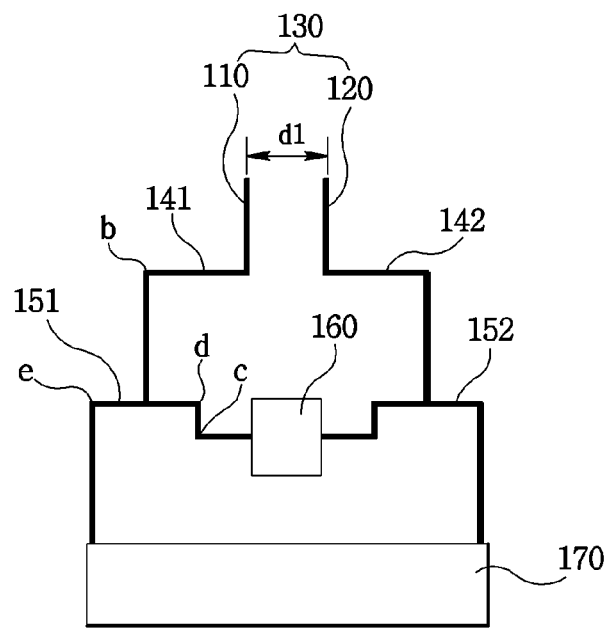
FIGS. 6a and 6b are schematic plan views illustrating a state where a force transmission part of the micro gripper is operated according to an exemplary embodiment of the present invention.
Figure 6B:
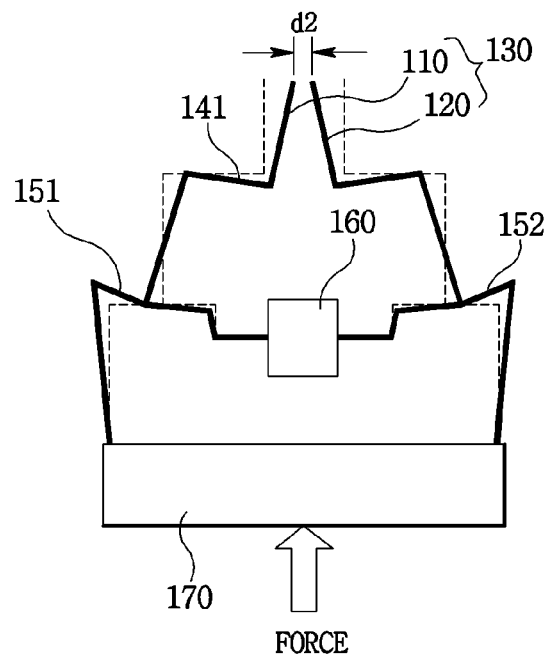

FIGS. 6a and 6b are schematic plan views illustrating a state wherein a force transmission part of the micro gripper according to an exemplary embodiment of the present invention is operated.

The force transmission part of the gripper jaw 130 includes: first connection parts connected to respective ends of the first and second structures 110 and 120 of the gripper jaw 130 after being bent once (b); second connection units partially connected to respective ends of the first connection units 141 and 142 after being bent three times (c, d and e); a fixing unit 160 respectively connected to one end of the second connection units 151 and 152; and a transmission unit 170 respectively connected to the other end of the second connection units 151 and 152.

If a force is transmitted to the transmission unit 170 of the force transmission part as constituted above, the first and second connection units 141, 142, 151 and 152 are changed in shape thereof as the fixing unit 160 is fixed, and the distance between the first and second structures 110 and 120 of the gripper jaw 130 becomes narrower, moving from an initial distance 'd1' shown in FIG. 6a, to a distance 'd2' shown in FIG. 6b, whereby, it is possible to grip the object.

Figure 7:
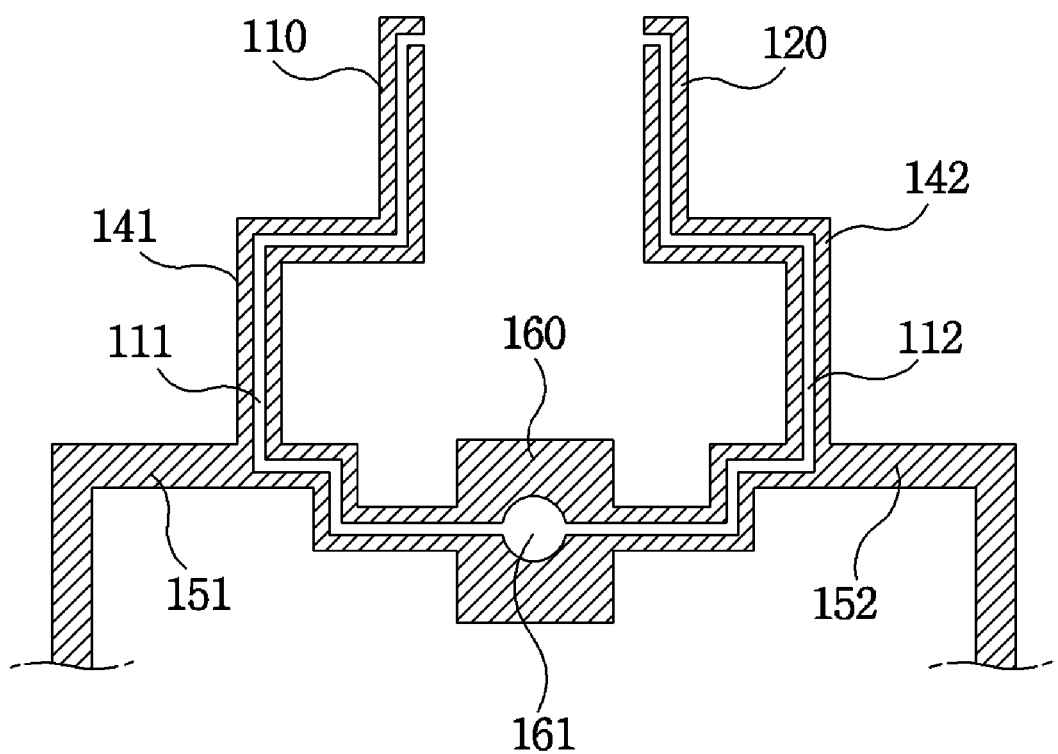
FIG. 7 is a partial, detailed cross-sectional view of the force transmission part of the gripper jaw as shown in FIGS. 6a and 6b.

FIG. 7 is a detailed partial cross-sectional view of the force transmission part of the gripper jaw shown in FIGS. 6a and 6b.

A groove 161 connected to the fluid supply and suction unit is formed on a lower portion of the fixing unit 160 of the force transmission part, and the groove 161 is connected to the penetration holes 111 and 112 formed inside of the first and second connection units 141, 142, 151 and 152 and the first and second structures 110 and 120 of the gripper jaw.

Accordingly, the fluid is discharged from the opposite surfaces of the first and second structures 110 and 120 of the gripper jaw through the groove 161 of the fixing unit 160 and the penetration holes 111 and 112, so that the micro object, attached to the first and second structures 110 and 120 after the gripping process, is detached from the first and second structures 110 and 120.

Figure 8:
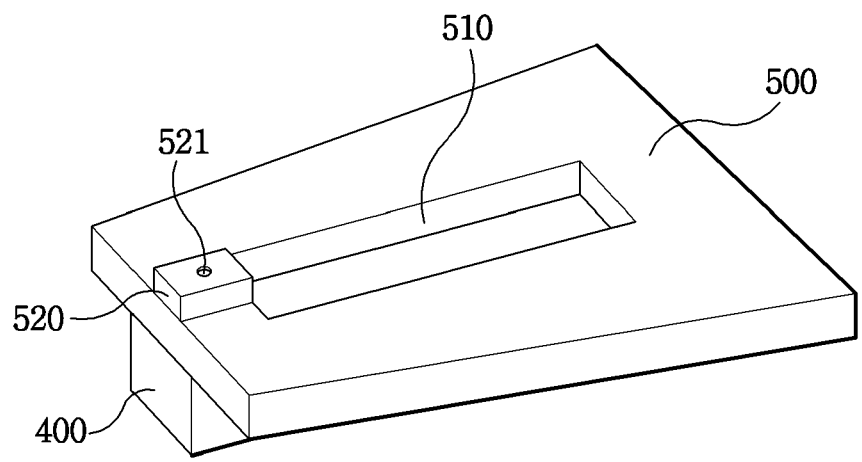
FIG. 8 is a schematic perspective view of a structure on which the force transmission part of the micro gripper is mounted, as shown in FIGS. 6a and 6b.

FIG. 8 is a schematic perspective view of a structure in which the force transmission part of the micro gripper, as shown in FIGS. 6a and 6b, is mounted.

A groove 510 is formed on an upper surface of the structure 500 in which the force transmission part of the micro gripper is formed, a protrusion unit 520 is formed on an upper surface between the groove 510 and a border and a penetration hole 521 is formed in the protrusion unit 520.

Further, the actuator is insertedly mounted inside of the groove 510.

In other words, the fixing unit of the force transmission part of the micro gripper is fixed to the protrusion unit 520.

Further, the penetration hole 521 of the protrusion unit 520 is connected to the fluid supply and suction unit 400.

Figure 9:
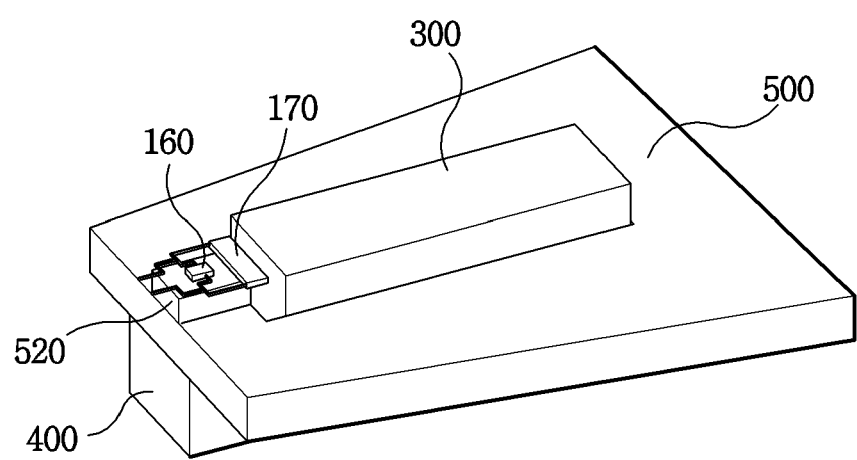
FIG. 9 is a perspective view illustrating a state wherein the micro gripper is mounted on the structure shown in FIG. 8.

FIG. 9 is a perspective view illustrating a state wherein the micro gripper is mounted on the structure shown in FIG. 8.

The fixing unit 160 of the force transmission part of the micro gripper is fixed on an upper surface of the protrusion unit 520 formed on an upper surface of the structure 500 shown in FIG. 8.

Accordingly, the gripper jaw may grip the micro object easily without obstruction by being floated from the structure 500.

The transmission unit 170, as shown in FIG. 6a, is provided with a gripping force from an actuator 300 mounted on the groove 510 of the structure 500.

FIGS. 10a to 10l are cross-sectional views illustrating a manufacturing process of the gripper jaw according to an exemplary embodiment of the present invention.

Figure 10A:
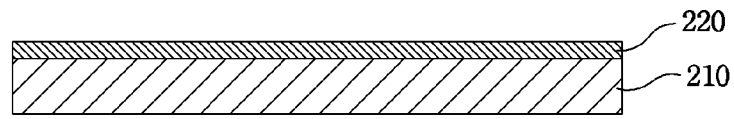
FIGS. 10a to 10l are cross-sectional views illustrating a manufacturing process of the gripper jaw according to an exemplary embodiment of the present invention.

First, a seed layer 220 is deposited on an upper surface of a substrate 210. (FIG. 10a)

The seed layer 220 is formed on the upper surface of the substrate 210 for depositing a metal in the following process, and is made from one of Cr/Au, Ni/Cr/Au and NiCr/Au.

Figure 10B:
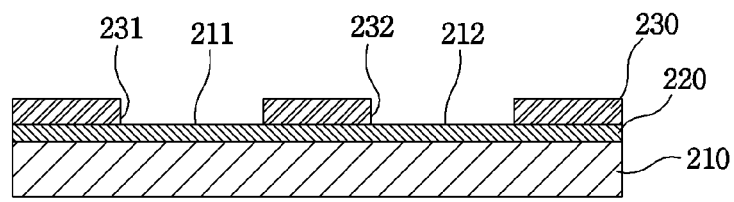

Next, a pair of apertures 231 and 232 is formed by forming a first photoresist layer 230 on an upper surface of the seed layer 220 and selectively removing the first photoresist layer 230 so as to expose a region of the seed layer 220. (FIG. 10b)

The first photoresist layer 230 is formed to have a thickness ranging from 5 to 150 μm, and uses a photoresist such as JSR, AZ 4620, polymethylmethacrylate (PMMA) and SU8.

Figure 10C:
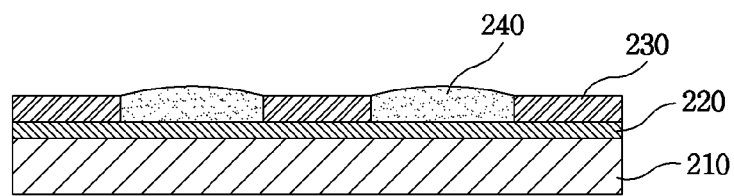

Next, a first metal 240 is filled inside of the apertures 231 and 232. (FIG. 10c)

The first metal 240 is formed by performing a plating process.

Figure 10D:
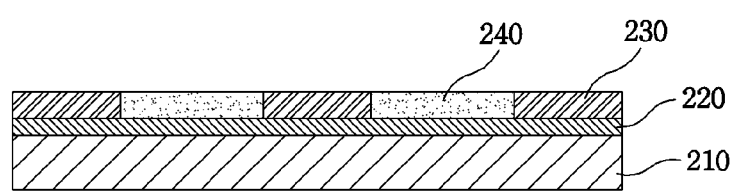

Upper surfaces of the first photoresist layer 230 and the first metal 240 filled inside of a pair of apertures 231 and 232 are planarized. (FIG. 10d)

The above planarization is performed using a chemical mechanical polishing (CMP) process.

Figure 10E:
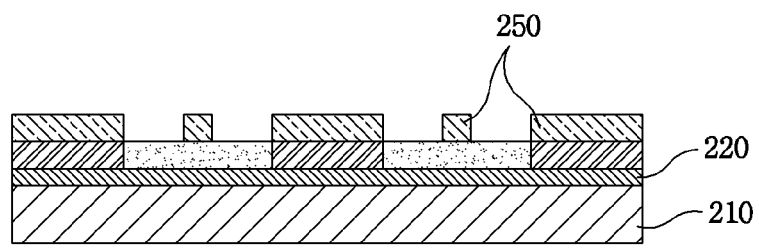

A second photoresist layer 250 is formed on the upper surface of the first photoresist layer 230 and the center of the upper surface of the first metal 240. (FIG. 10e)

A second metal 260 is formed on the upper surface of the first metal 240 while surrounding the second photoresist layer 250 on the upper surface of the first metal 240.

The upper surfaces of the second photoresist layer 230 and the second metal 260 are planarized. (FIG. 10g)

The above planarization is selectively performed.

According to the process of FIG. 10, the second photoresist layer 250 in the center of the second metal 260 is exposed.

Next, the second photoresist layer 250 of the second layer 260 and the center of the second metal 260 are exposed, and a third photoresist layer 270 is formed on an upper surface of the second photoresist layer 250. (FIG. 10h)

Afterwards, a third metal 280 is formed on the upper surface of the second metal 260, while surrounding the second metal 260 and the second photoresist layer 250 in the center of the second metal 260. (FIG. 10i)

As the third metal 280 is formed, the second photoresist layer 250 in the center of the second metal 260 is surrounded by a metal.

Upper surfaces of the third photoresist layer 270 and the third metal 280 are planarized. (FIG. 10j)

Next, the gripper jaw, which is composed of a first and second structure 610 and 620 each spaced a predetermined distance apart, is formed on the upper surface of the seed layer 220. The gripper jaw made of a metal forms a penetration hole 290 by removing the first to third photoresist layers 230, 250 and 270. (FIG. 10k)

The second photoresist layer 250 is removed, and the penetration hole 290, that enables the fluid to flow inside of the first to third metals 240, 260 and 280, is formed.

Additionally, if a suitable patterning process is performed in the process as described above, the gripper jaw in which the penetration hole 290 is exposed on respective opposite surfaces of the first and second structures 610 and 620 may be formed.

The first and second structures 610 and 620 are detached from the substrate 210 and the seed layer 220. (FIG. 10l)

Meanwhile, the first to third metals 240, 260 and 280 may be formed by low stress electro plating, and use one of Ni, Cu, Nip, Niw and NiB without being bent and may not have partial overhang when it comes to forming the structure.

Figure 10F:
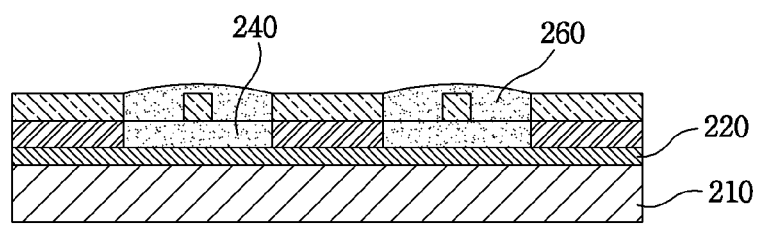
Figure 10G:
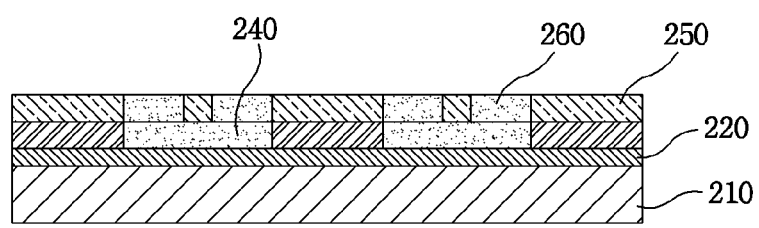
Figure 10H:
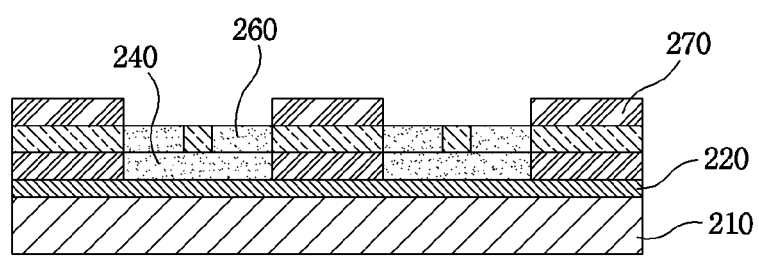
Figure 10I:
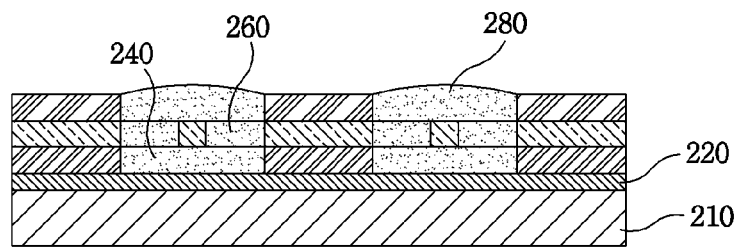
Figure 10J:
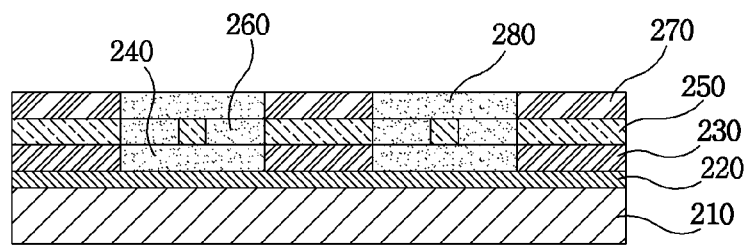
Figure 10K:
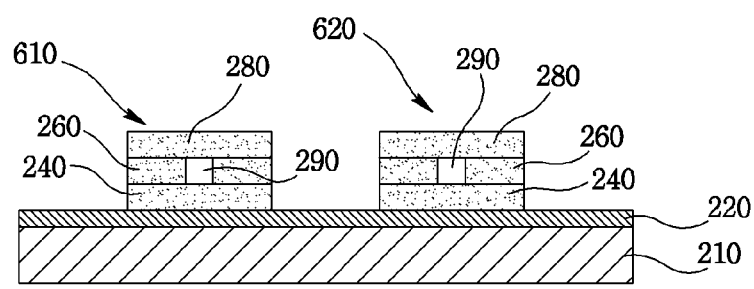
Figure 10L:
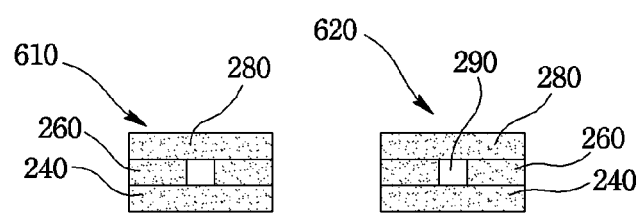

Accordingly, a manufacturing process of the gripper jaw according to an exemplary embodiment of the present invention, includes: depositing a seed layer 220 on an upper surface of a substrate 210 (FIG. 10a); forming a pair of metal islands each spaced a predetermined distance apart on the upper surface of the seed layer 220 (FIGS. 10b to 10d); forming a photoresist layer on respective center upper surfaces of a pair of first metal islands (FIG. 10e); and depositing a metal while surrounding the first metal islands, including the photoresist layer (FIGS. 10f and 10g)

Next, the gripper jaw is formed on the upper surface of the seed layer 220 composed of the first and second structures 610 and 620 each spaced apart. The first and second structures 610 and 620 have a penetration hole formed thereon by removing the photoresist layer and consist of a metal. (FIG. 10k)

Finally, as shown in FIG. 10l, a process for separating the gripper jaw 610 and 620 from the substrate and the seed layer is performed.

FIGS. 11a to 11j are cross-sectional views illustrating a manufacturing process of the gripper jaw according to another exemplary embodiment of the present invention.

Figure 11A:
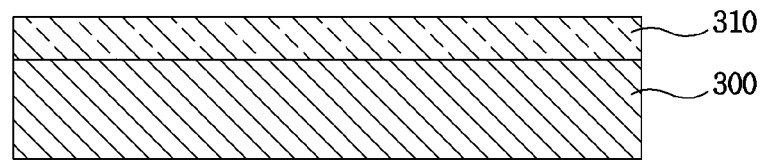
FIGS. 11a to 11j are cross-sectional views illustrating a manufacturing process of the gripper jaw according to another exemplary embodiment of the present invention.

Referring to FIG. 11a, a first photoresist layer 310 is formed on an upper surface of the first substrate 300.

Figure 11B:
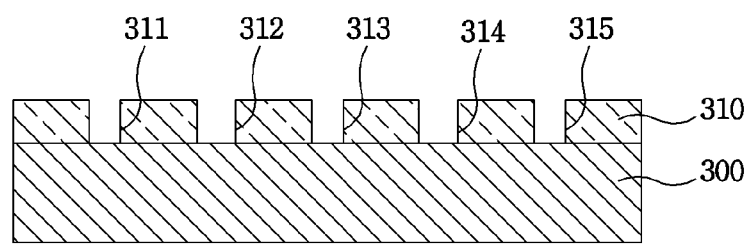

As the first photoresist layer 310 is selectively removed, an upper surface of the semiconductor substrate 300 is exposed, and first to fifth apertures 311, 312, 313, 314 and 315, all of which are spaced from each other, are formed. (FIG. 11b)

Figure 11C:
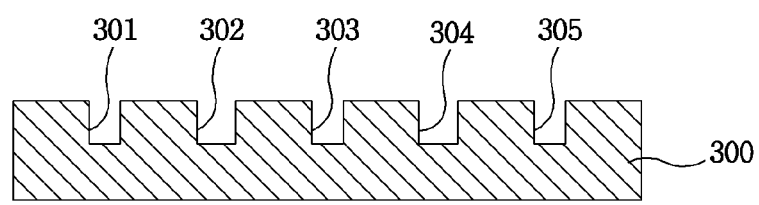

First to fifth grooves 301, 302, 303, 304 and 305 which are spaced from each other are formed by etching the upper surface of the first substrate 300 using the first photoresist layer 310 as a mask. (FIG. 11c)

It is desirable to perform the etching of the upper surface of the first substrate 300 using a reactive ion etching (RIE) method.

Figure 11D:
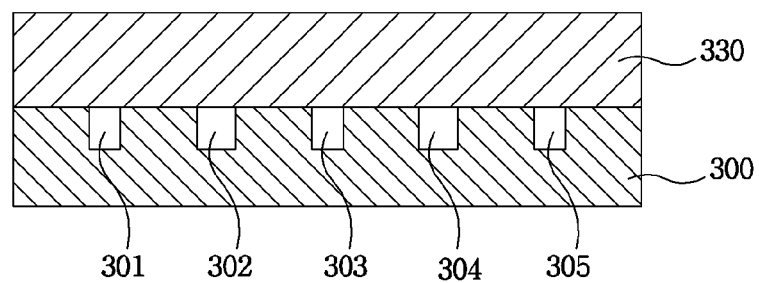

The second substrate 330 is bonded on the upper surface of the semiconductor substrate 300 on which the first to fifth grooves 301, 302, 303, 304 and 305 are formed. (FIG. 11d)

It is desirable to bond the first and second substrates 300 and 330 by way of anodic bonding method.

Accordingly, the first and second substrates 300 and 330 consist of anodic bondable materials.

For example, the first and second substrates 300 and 330 are anodic-bonded by forming an oxide film between first and second substrates 300 and 330 if the first and the second substrates 300 and 330 are contacted, a positive electrode '+' being connected to the first substrate 300 and a negative electrode '−' being connected to the second substrate 330, by using the first substrate 300 as a silicon substrate and the second substrate 330 as a glass substrate including ions for forming an electric field such as Na or K, Next, an upper surface of the second substrate 330 is polished. (FIG. 11e)

At this time, the polishing is performed through a CMP process.

Figure 11E:
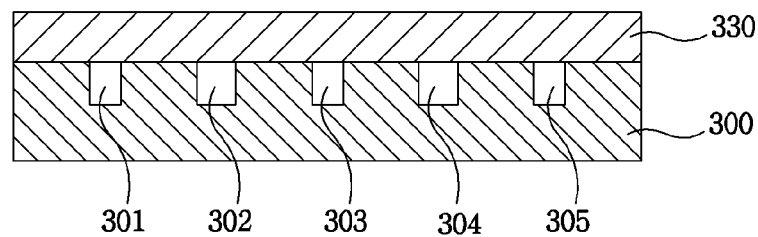

The process of FIG. 11e is selectively performed using the method for manufacturing the gripper jaw according to the present invention.

Figure 11F:
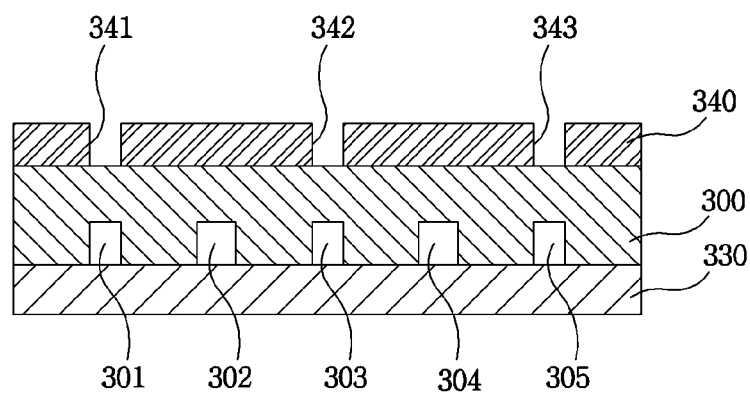

A second photoresist layer 340, having apertures 341, 342 and 343 for exposing a region of the first substrate 300 corresponding to the first, third and fifth grooves 301, 303 and 305, is formed on the upper surface of the first substrate 300. (FIG. 11f)

Figure 11G:
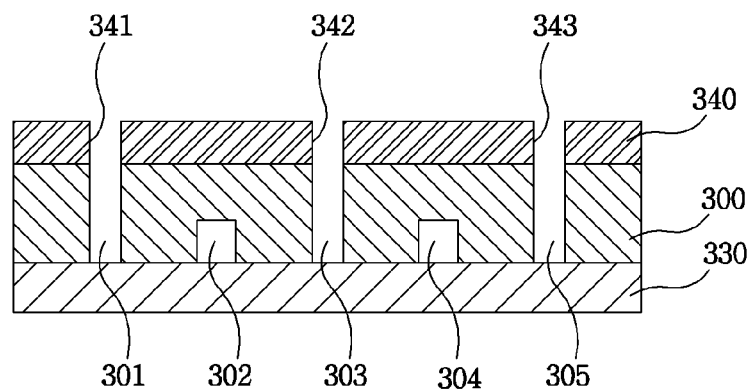

The first substrate 300 is selectively etched to enable the apertures 341, 342 and 343 formed on the second photoresist layer 340 to communicate with the first, third and fifth grooves 301, 303 and 305. (FIG. 11g)

Figure 11H:
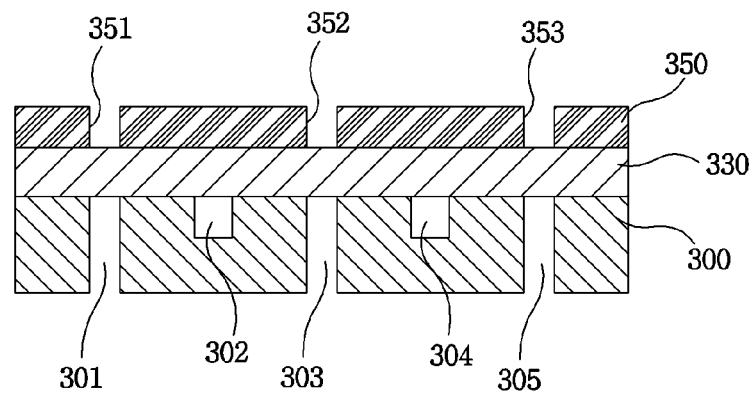

A dry film 350 having the apertures 351, 352 and 353 for exposing a region of the second substrate 330, which corresponds to the first, third and fifth grooves 301, 303 and 305 formed on the first substrate 300, is formed on the second substrate 330 by removing the second photoresist layer 340. (FIG. 11h)

The second substrate 330 is selectively etched to enable the apertures 351, 352 and 353, which are formed on the dry film 350, to communicate with the first, third and fifth grooves 301, 303 and 305. (FIG. 11i)

Figure 11I:
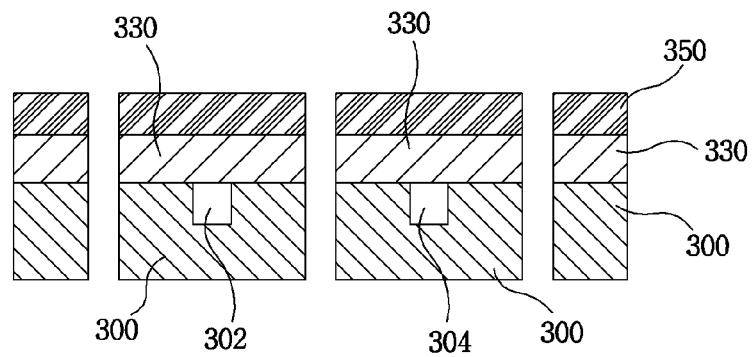
Figure 11J:
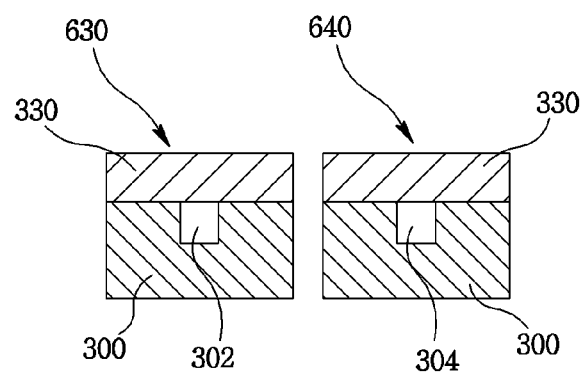

If the process of FIG. 11i is performed, a gripper jaw, composed of first and second structures 630 and 640 each spaced a predetermined distance apart, is formed, a penetration hole being formed inside of the first and second substrates 300 and 330 that are bonded.

Accordingly, a manufacturing process for the gripper jaw according to another exemplary embodiment of the present invention includes the formation of the first to fifth grooves 301, 302, 303, 304 and 305, all of which are spaced apart from each other, on the upper surface of the first substrate 300. (FIGS. 11a to 11c)

The second substrate 330 is bonded to the upper surface of the first substrate 300 on which the first to fifth grooves 301, 302, 303, 304 and 305 are formed. (FIG. 11d)

Further, the gripper jaw, which is composed of the first and second structures 630 and 640 that are spaced apart from each other, is formed by removing the first and second substrates 300 and 330 corresponding to the first, third and fifth grooves 301, 303 and 305, in which the penetration hole is formed inside of the first and second substrates 300 and 330 that are bonded. (FIG. 11e to 11i)

The above-described manufacturing method may perform the gripping of a micro object and manufacture a pair of structures of the gripper jaw in which the penetration hole is formed inside of the structures. Other structures for connecting to the structures and implementing the gripper jaw may be freely designed and variable.

Accordingly, the present invention has an advantage of manufacturing the gripper jaw simply using electric plating and substrate bonding method.

As described above, the micro gripper, according to the present invention, supplies the fluid to the penetration hole of the gripper jaw and discharges the fluid from the opposite surfaces of the first and second structures of the gripper jaw, thereby completely detaching the object attached to the opposite surfaces of the first and second structures by electrostatic force and thus removing the stiction.

Further, the present invention can grip the object more strongly by applying a suction force to the fluid in the penetration hole of the gripper jaw, when the first and second structures grip the object.

Accordingly, the present invention can easily grip and release the micro components or bio cells, thereby allowing components and cells to be smoothly moved and fixed and allowing a manufacturing process of a micro device using a micro component to be rapidly performed.

Further, according to the present invention, the gripper jaw can be easily manufactured using the electric plating and substrate bonding method.

It should be understand by those of ordinary skill in the art that various replacement, modifications and changes in the form and details may be made therein without departing from the sprit and scope of the present invention as defined by the following claims. Therefore, it is to be appreciated that the above described embodiments are for purpose of illustration only and are not to be construed as limitations of the invention.

What is claimed is:

1. A micro gripper, comprising:
    a micro gripper jaw composed of first and second structures each oppositely spaced a predetermined distance (d1) apart, in which a penetration hole that enables fluid to flow inside the respective structures is respectively formed, and the penetration hole is respectively exposed on opposite surfaces of the first and second structure, where the first and second structures of the gripper jaw are formed with a first substrate and a second substrate each with the penetration hole formed therein;
    a force transmission part, connected to the first and second structures of the gripper jaw, configured to transmit a force, to enable the first and second structures of the gripper jaw to grip an object by narrowing the distance (d1) there between;
    an actuator providing a force to the force transmission part;
    a fluid supply and suction unit configured to supply the fluid to the penetration hole of the gripper jaw so as to detach the object attached to opposite surfaces of the first and second structures, or suck the fluid from the penetration hole of the gripper jaw so as to enable the first and second structure to strongly grip the object.

2. The micro gripper of claim 1, wherein the force transmission part comprises:
    first connection parts connected to respective ends of the first and second structures of the gripper jaw after being bent once;
    second connection parts partially connected to respective ends of the first connection units after being bent three times;
    a fixing part connected to one end of the second connection units, respectively; and
    a transmission unit connected to the remainder of the second connection units, respectively.

3. The micro gripper of claim 2, wherein a groove connected to the fluid supply and suction unit is formed on a lower portion of the force transmission part, and the groove is connected to the penetration hole formed inside of both the first and second connection units and the first and second structures of the gripper jaw.

4. The micro gripper of claim 3, wherein the fixing part of the force transmission part is fixed to the structure, a groove is formed on an upper surface of the structure, the actuator is mounted inside of the groove, a protrusion part is formed on an upper surface between the groove and its border, a penetration hole is formed in the protrusion part, and the fixing part of the force transmission part is fixed to the protrusion part to enable the groove of the lower portion of the fixing part of the force transmission part to be connected to the fluid supply and suction part through the penetration hole of the protrusion part.

* * * * *